(12) United States Patent
Basol et al.

(10) Patent No.: US 6,716,084 B2
(45) Date of Patent: Apr. 6, 2004

(54) CARRIER HEAD FOR HOLDING A WAFER AND ALLOWING PROCESSING ON A FRONT FACE THEREOF TO OCCUR

(75) Inventors: Bulent M. Basol, Manhattan Beach, CA (US); Cyprian E. Uzoh, Milpitas, CA (US); Konstantin Volodarsky, San Francisco, CA (US)

(73) Assignee: Nutool, Inc., Milpitas, CA (US)

(*) Notice: Subject to any disclaimer, the term of this patent is extended or adjusted under 35 U.S.C. 154(b) by 0 days.

(21) Appl. No.: 10/043,656

(22) Filed: Jan. 8, 2002

(65) Prior Publication Data

US 2002/0151257 A1 Oct. 17, 2002

Related U.S. Application Data

(60) Provisional application No. 60/260,681, filed on Jan. 11, 2001.

(51) Int. Cl.$^7$ .................................. B24B 1/00
(52) U.S. Cl. ..................... 451/4; 451/388; 451/398; 451/288; 451/289
(58) Field of Search .................... 451/285–289, 451/388, 398, 397, 41, 5; 269/21; 438/692, 693; 279/3

(56) References Cited

U.S. PATENT DOCUMENTS

| | | | | | |
|---|---|---|---|---|---|
| 3,747,282 A | * | 7/1973 | Katzke | ......................... | 451/388 |
| 4,009,539 A | * | 3/1977 | Day | ............................ | 451/288 |
| 4,357,006 A | * | 11/1982 | Hayes | .......................... | 269/21 |
| 4,603,867 A | * | 8/1986 | Babb et al. | ..................... | 279/3 |
| 5,423,716 A | * | 6/1995 | Strasbaugh | ................... | 451/388 |
| 5,624,299 A | * | 4/1997 | Shendon | ....................... | 451/28 |
| 5,804,507 A | | 9/1998 | Perlov et al. | | |
| 5,916,015 A | * | 6/1999 | Natalicio | ...................... | 451/288 |
| 5,993,302 A | * | 11/1999 | Chen et al. | ................... | 451/285 |
| 6,030,275 A | * | 2/2000 | Lofaro | ............................ | 451/5 |
| 6,080,050 A | | 6/2000 | Chen et al. | | |
| 6,227,955 B1 | * | 5/2001 | Custer et al. | ................ | 451/285 |
| 6,280,308 B1 | * | 8/2001 | Ishikawa et al. | ............. | 451/388 |
| 6,406,361 B1 | * | 6/2002 | Zuniga et al. | ................ | 451/287 |
| 6,443,824 B2 | * | 9/2002 | Shendon et al. | .............. | 451/288 |
| 6,447,379 B1 | * | 9/2002 | Gromko et al. | .............. | 451/287 |
| 6,527,625 B1 | * | 3/2003 | Kajiwara et al. | .............. | 451/41 |

FOREIGN PATENT DOCUMENTS

| | | |
|---|---|---|
| EP | 0 859 399 | 8/1998 |
| EP | 1 048 406 | 11/2000 |
| EP | 1 048 408 | 11/2000 |
| EP | 1 067 590 | 1/2001 |

\* cited by examiner

*Primary Examiner*—George Nguyen
(74) *Attorney, Agent, or Firm*—Pillsbury Winthrop LLP

(57) ABSTRACT

The present invention uses some type of inflatable membrane during processing to establish a vacuum and/or provide a resilient cushion on which the backside of the wafer can rest. In one aspect, the present invention provides an outer vacuum that allow for attachment of the wafer to the carrier head during processing, and also provides an inner inflatable membrane that provides a resilient cushion on which the backside of the wafer can rest during processing. In other aspects, the present invention provides a membrane that is displaceable with a vacuum within certain cavity regions to provide for attachment of the wafer to the wafer carrier.

8 Claims, 6 Drawing Sheets

CARRIER HEAD FOR HOLDING A WAFER AND ALLOWING PROCESSING ON A FRONT FACE THEREOF TO OCCUR

This application is related to and claims priority from, U.S. Provisional Application No. 60/260,681, filed Jan. 11, 2001.

BACKGROUND OF THE INVENTION

1. Field of the Invention

The present invention generally relates to semiconductor processing technologies and, more particularly, to a semiconductor wafer processing system.

2. Description of the Related Art

In the semiconductor industry, various processes can be used to deposit and etch materials on the wafers. These processes include material removal processes, such as chemical mechanical polishing (CMP), and deposition processes, such as electro chemical deposition (ECD).

Other material removal and deposition processes have more recently been introduced. These include electrochemical mechanical processing (ECMPR) including electrochemical mechanical deposition (ECMD) and electrochemical mechanical etching (ECME), which are described in U.S. Pat. No. 6,176,992 entitled "Method and Apparatus For Electro Chemical Mechanical Deposition", commonly owned by the assignee of the present invention.

In the ECMD process, a conductor such as copper may be deposited on a semiconductor wafer or a work piece by having electrical current carried through an electrolyte that comes into contact with the surface of the wafer (cathode). The ECMD process, in one aspect, is able to uniformly fill the holes and trenches on the surface of the wafer with the conductive material while maintaining the planarity of the surface.

In the ECME process, a conductor such as copper previously deposited on a semiconductor wafer or a work piece can be removed by having electrical current carried through an electrolyte that comes into contact with the surface of the wafer (anode). The ECME process, in one aspect, is able to uniformly remove the conductor in a planar manner, thus maintaining the planarity of the surface.

A more detailed description of the ECMPR methods and apparatus can be found in the U.S. Pat. No. 6,176,992, noted above.

As generally exemplified in FIG. 1, the ECMPR system 10, being used for ECMD, includes a deposition chamber 12 which contains an anode 14, a pad 16 having openings 18 and an electrolyte 20 filling the chamber 12. The anode 14 may be attached to the bottom of the chamber 12. Further, a carrier head 22 having a rotatable shaft 23 holds and positions the wafer 24 against the pad 16. The wafer 24 is placed on a surface 26 of a carrier base 28 (chuck) of the carrier head 22. During the deposition and mechanical material removal steps, the carrier head secures 22 the wafer 24 to the surface 26 of the base 28 of the carrier head 22 by applying vacuum to the back of the wafer and using clamps 30. Vacuum is applied using vacuum lines 32 extending through the carrier base 28 and the body of the carrier head 22. Clamps 30 may also seal the electrical contacts to the wafer 24. During the material removal step, the carrier head provides a controllable load to the wafer to push it against the pad. A more detailed description of the carrier head may be found in the co-pending U.S. application Ser. No. 09/472,523, entitled "Work Piece Carrier Head For Plating and Polishing" filed Dec. 27, 1999, commonly owned by the assignee of the present invention. For a detailed description of the pad, reference can be made to assignee's co-pending application Ser. No. 09/511,278, entitled "Pad Design and Structures For a Versatile Materials Processing Apparatus" filed Feb. 23, 2000, the specification of which is incorporated by reference herein as non-essential matter.

During an ECMPR, the wafer carrier holds the wafer with proper vacuum suction. As a result, the wafer does not become detached by the application of a weak vacuum. Further, it is important that the wafer not become damaged by the application of a high vacuum suction. During ECMPR, back side of the wafer should not be exposed to the processing solutions, which could be a plating electrolyte. Also, in conventional CMP processes, during the process the wafer is held by a retaining ring that is placed around the circumference of the carrier head. Such systems allow process solutions, such as slurry, to wet the back side of the wafer during the CMP process. Conventional CMP systems do not use vacuum suction during the CMP process to hold the wafer on the carrier. Therefore there is a need in the industry for ECMPR or CMP systems that do not expose back side of the wafer to the processing solutions such as electrolyte or slurries.

Also, in such processes, a resilient cushion on which the backside of the wafer can rest should be provided. Methods and apparatus providing fall face contact for processing on the front face of the wafer while providing the above considerations are desirable in the industry.

To this end, there is a need for alternative carrier head designs.

SUMMARY OF THE INVENTION

It is an object of the present invention, therefore, to provide an improved carrier head.

It is a further object of the present invention to provide an improved carrier head that is usable for either electrochemical mechanical processing and chemical mechanical processing.

It is a further object of the present invention to provide a carrier head that does not expose the back of a wafer to processing solution, provides full face contact for processing on the front face of the wafer, and provides a resilient cushion on which the backside of the wafer can rest.

These and other objects of the invention, either singly or in combination, are achieved by the present invention. Most generally, the present invention uses some type of inflatable membrane during processing to establish a vacuum and/or provide a resilient cushion on which the backside of the wafer can rest.

In one aspect, the present invention provides an outer vacuum that allow for attachment of the wafer to the carrier head during processing, and also provides an inner inflatable membrane that provides a resilient cushion on which the backside of the wafer can rest during processing.

In other aspects, the present invention provides a membrane that is displaceable with a vacuum within certain cavity regions to provide for attachment of the wafer to the wafer carrier.

BRIEF DESCRIPTION OF THE DRAWINGS

The above and other objectives, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENTS OF THE INVENTION

Reference will now be made to the drawings wherein like numerals refer to like parts throughout.

Figure 1:
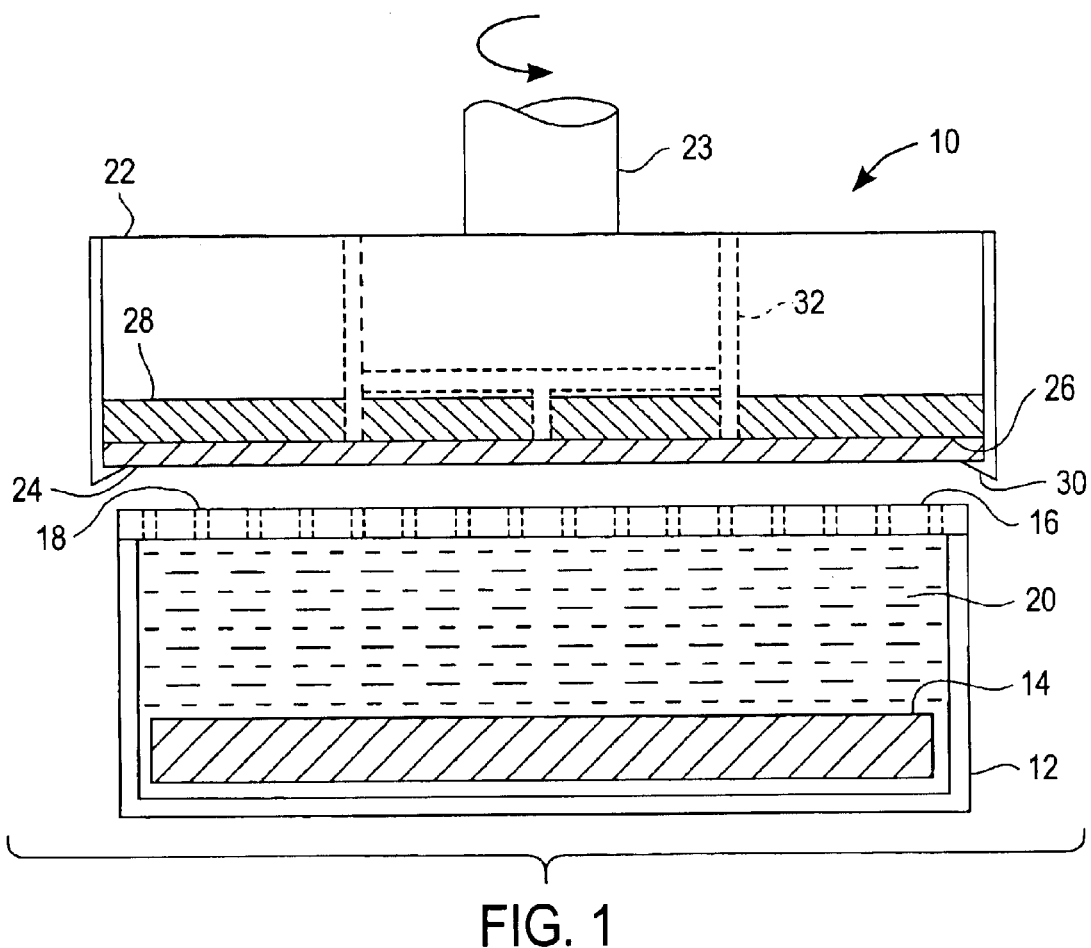
FIG. 1 illustrates a known ECMD system.
Figure 2A:
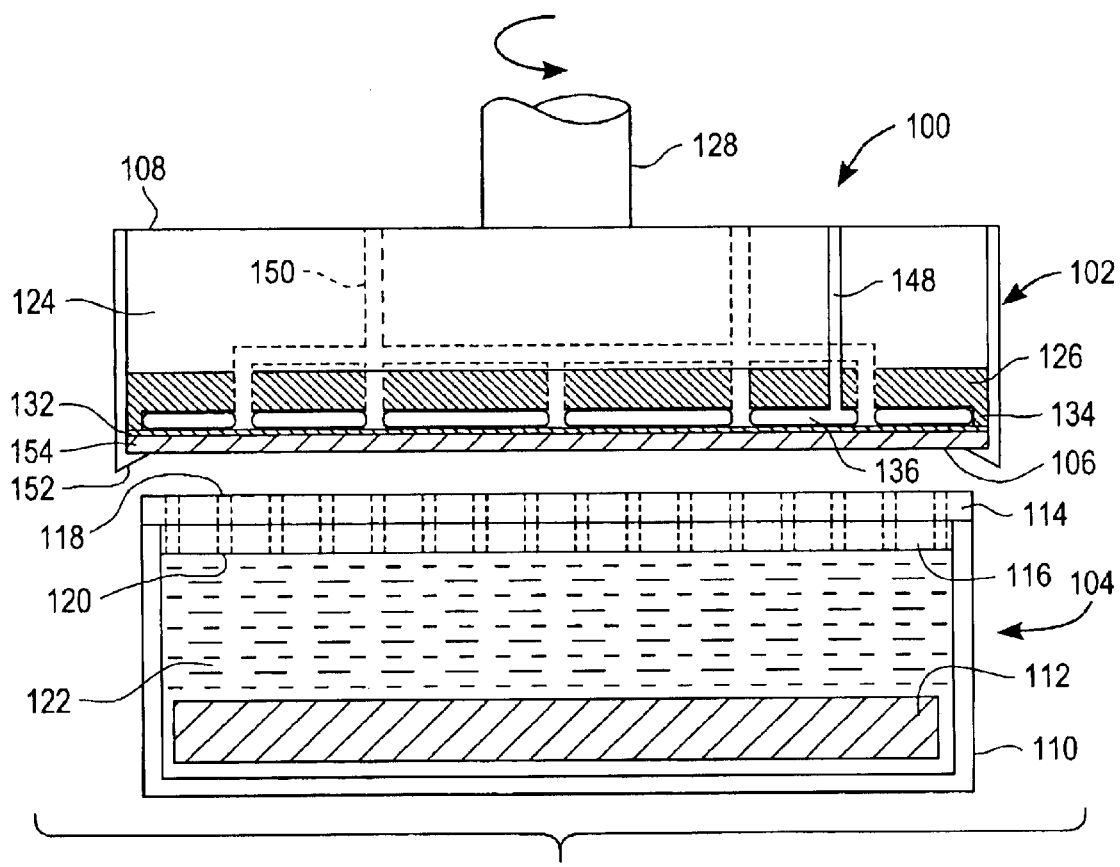
FIGS. 2A–2B illustrate a first embodiment of a carrier head according to the present invention.

FIG. 2A shows one embodiment of a carrier head 108 according to the present invention, which carrier head is shown within an electrochemical mechanical processing (ECMPR) system 100. In the ECMPR system, there is preferably an upper portion 102 and a lower portion 104, with the carrier head 108 making up the upper portion 102 of the system 100. The carrier head 108 may rotate or move a wafer 106 laterally or vertically.

In one embodiment, as mentioned above, the system 100 may be an ECMD system used to deposit a conductive material such as copper on a semiconductor wafer 106 such as silicon wafer. Although copper is used as an example, the present invention may be used for deposition of other common conductors such as Ni, Pd, Pt, Au and their alloys. While the carrier head will be described for this embodiment in the context of an ECMD system, but it is understood that ECME could be used as well.

The lower portion 104 of the system 100 may be comprised of an anode cup 110, an anode 112, preferably a consumable copper anode, and a pad 114. The anode 112 is placed in the anode cup 110 and enclosed by an anode plate 116 upon which the pad 114 may be placed. The pad 114 and the anode plate 116 are both preferably perforated plates. The pad 114 may comprise a plurality of openings 118 or asperities. The openings 118 are adapted to generally match with the openings 120 in the anode plate 116 so that when they are attached together, corresponding openings form channels allowing electrolyte to flow through the plates 114, 116 and wet the front surface of the wafer 106 during the ECMD process. During the process the wafer 106 may be kept substantially parallel to an upper surface of the pad 114 and rotated by the carrier head 108. The wafer 106 may also be moved laterally by the carrier head 108. A copper plating electrolyte 122 is supplied into the anode cup and fills the anode cup 110. The anode 112 is electrically connected to a positive terminal of a voltage source (not shown) through an anode connector. It should be noted that if the pad 114 is made of a rigid material, the anode plate 118 may not be needed.

Figure 2B:
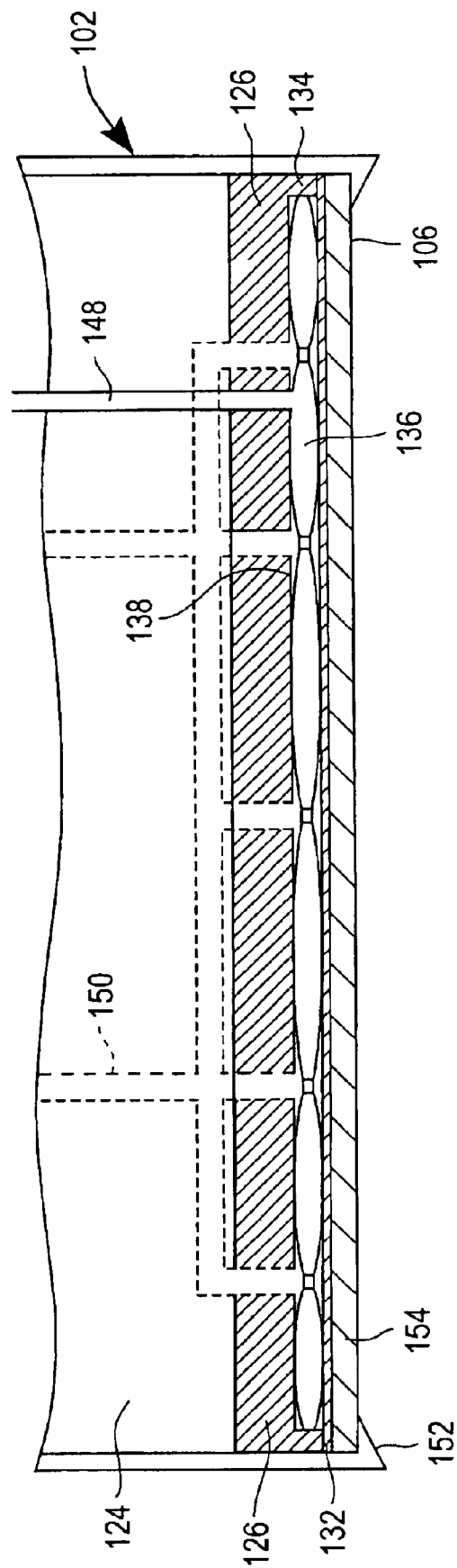

As shown in FIG. 2A and, in partial view, in FIG. 2B, the carrier head 108 comprises a carrier body 124 and a carrier base 126 where the wafer 106 is held. The carrier head 108 is rotated or moved through the shaft 128. Referring to FIG. 2B, the carrier base 126 comprises a cavity 130 enclosed by a membrane 132, preferably a flexible membrane, which may be attached to a peripheral wall 134 of the base 126. A backing member 136 is placed into the cavity 130 between a bottom wall 138 of the cavity and the membrane 132. The backing member 136 is comprised of an array of inflatable pockets 140 and connection regions 142 or valleys among the pockets 140. The backing member 136 may be comprised of an upper layer 144 and a lower layer 146 which are bonded together through the connection regions 142. The connection regions 142 may also have holes 143 formed through the connection regions 142. The inflatable pockets 140 are in fluid communication with one another through fluid channels (not shown) and are inflated through a fluid line 148. The pockets can be inflated using a gas, liquid or gel. The backing member is also attached to the peripheral wall of the base 126. The cavity 130 may be evacuated or pressurized via fluid lines 150. The wafer 106 is held on the flexible membrane 132 by a clamp ring 152 which also seals the electrical contacts to the cathode (wafer). Although in this example the wafer 106 is held by a clamp ring, the wafer may be held by a retaining ring (not shown) contacting an outer edge of the wafer 106. A retaining ring holds the wafer from its periphery and exposes the full front surface of the wafer without excluding any edge regions on the front surface of the wafer. In such case electrical contact to the wafer may be made using other electrical contact means.

In operation, after placing the wafer 106 on the membrane 132, the backing member 136 is inflated until the lower layer 146 contacts the membrane 132. The cavity 130 is then evacuated to apply vacuum suction to the wafer 106. As the vacuum is applied to the cavity, the connection regions 142 or valleys between the pockets 140 provide low pressure spaces and thereby cause the neighboring membrane portion to collapse into the valleys 142. This, in turn, generates a plurality of low pressure spaces on the back surface of the wafer 106. Such low pressure spaces provides adequate suction power to retain the wafer during the ECMD process. In another embodiment, depending on their relative locations with respect to the wafer, some pockets can be connected to separate pressure sources to create a variable pressure gradient at the back of the wafer so that the thickness uniformity of the deposition can be controlled by differing pressure behind the wafer during the ECMD process. For example, the pockets located above the center of the wafer can be connected to first pressure source through a first fluid line while the pockets located above the periphery of the wafer are connected to a second pressure source through a second fluid line. Exerting higher pressure to the center but less pressure to the periphery of the wafer significantly increases the mechanical component of the process at the center of the wafer in comparison to the mechanical component at the periphery of the wafer.

Figure 3A:
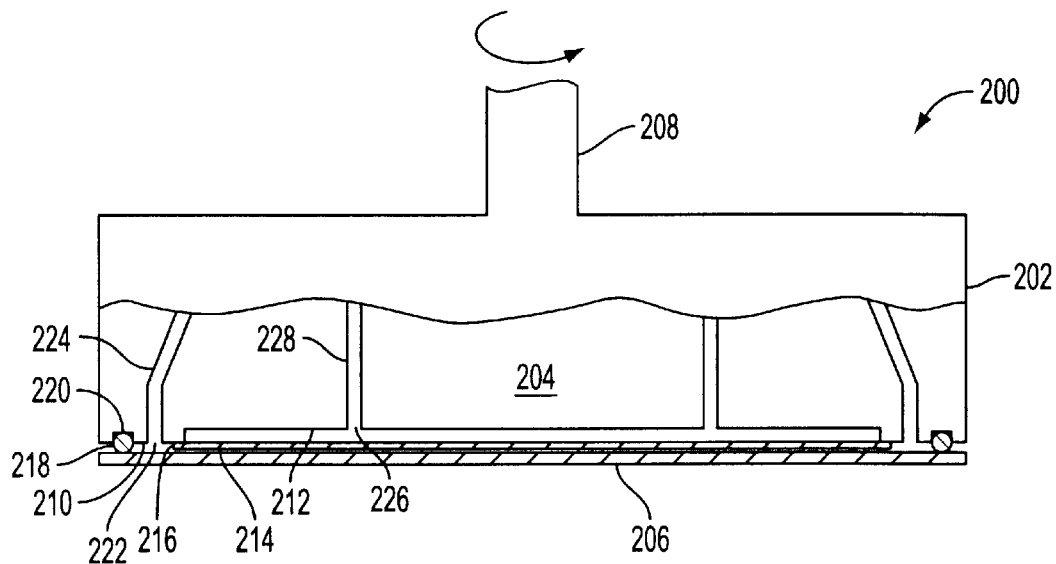
FIGS. 3A–3C illustrate a second embodiment of a carrier head according to the present invention.

In another embodiment, as shown in FIG. 3A, the carrier head 200 comprises a carrier body 202 and a carrier base 204 where the wafer 206 is held. The carrier head 200 of the present embodiment can be used with CMP process or ECMPR. The carrier head 200 is rotated or moved through the shaft 208. The carrier base 204 comprises a raised surface area 210 and a recessed or cavity surface area 212 of the carrier head 200. The raised surface area 210 is a circular area surrounding the cavity 212. A flexible or inflatable membrane 214 sealably encloses the cavity 212 along the inner circumference of the raised surface area 210.

The inflatable membrane 214 corresponds in shape to the carrier head, and is thus typically circular in shape, and is attached adjacent to the inner circumference of the raised surface area. The inflatable membrane 214 provides a compliant wafer support during the process, such as CMP process or ECMPR.

If the membrane 214 is flexible but not inflatable, a spongy material can be used and it attaches to the cavity surface area 212.

If the membrane 214 is inflatable, it will be made of a thin compliant material, such as an elastomer, preferably Viton®, that is attached to an edge region 216 of the membrane 214, preferably using a combination of glue and fasteners or clamping mechanism, in order to hold and seal the membrane 214 in place when inflated, as described hereinafter. In case of using a clamping mechanism, the raised surface 210 may be machined to form a recess around the cavity 212 so as to place a clamping mechanism (not shown).

A gasket member 218 is placed adjacent the outer circumference of the raised surface area 210. The gasket member 218 is preferably an o-ring placed into a gasket member or o-ring groove 220. A series of vacuum ports 222 are radially distributed along the raised surface area 210, between the gasket member 218 and the edge region 216 of the membrane 214. The ports 222 are connected to a vacuum source (not shown) through vacuum lines 224. The gasket member 218 seals space between the back of the wafer and the area covered by the raised surface area 210 and the inflatable membrane 214. The cavity 212 has series of fluid ports 226 that are connected to a fluid source, such as gas, through fluid lines 228. As will be described below, the fluid from the fluid lines 228 is used to inflate the inflatable membrane 214 and maintain the inflation through the processing that takes place. During the processing that takes place, the pressure applied within the cavity 212 is preferably within the range of 0.1 to 2.5 psi.

Figure 3B:
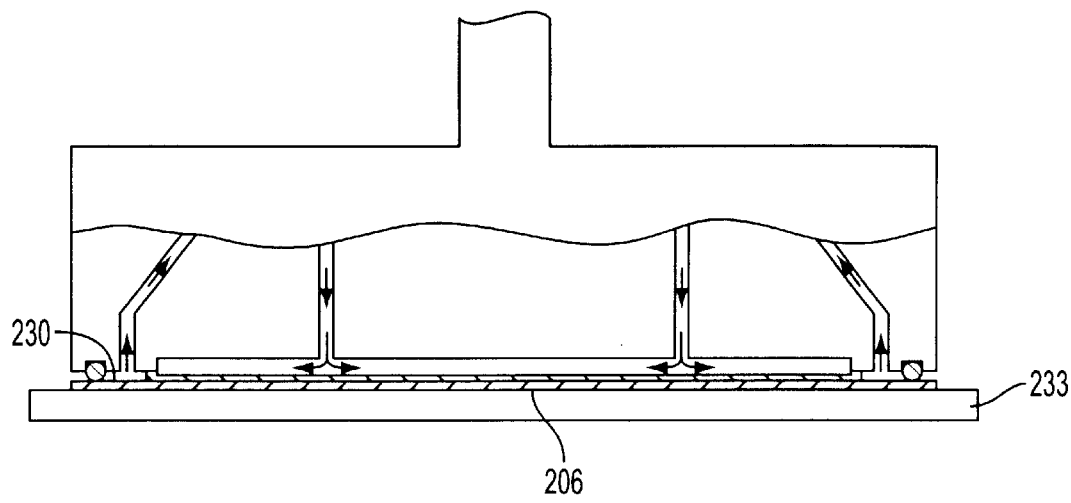
Figure 3C:
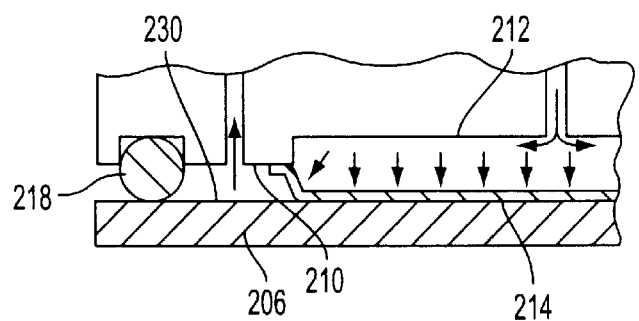

As shown in FIGS. 3B–3C, in operation, backside 230 of the wafer 206 is placed on the gasket member 218 and vacuum is applied through ports 222, typically in an amount in the range of 15 to 25 inches of Hg to hold the wafer on the carrier 200. In this embodiment, vacuum is applied throughout the process. It is understood that in this embodiment front surface 232 of the wafer is fully exposed. Preferably, when the wafer front surface 232 is contacted to a pad 233 inflation of the inflatable membrane 214 may begin. However, inflation may be started before the wafer is contacted to the pad 233. The pad 233 can be either a pad used during the ECMPR process or a polishing pad used for CMP process. The pad used in CMP may be an abrasive polishing pad.

As shown in FIG. 3C, the pressure created by the fluid pumped into the cavity 212 moves the membrane against the backside 230 of the wafer 206. This pressure not only prevents the center of the wafer from sinking during the mechanical stage of the process when the pad 114 contacts the wafer 206, but also provides a cushion or resilience not possible without the flexible or inflatable membrane 214.

As mentioned before the membrane 214 provides a compliant wafer support during a CMP or ECMPR process. Apart from the other embodiments disclosed herein, the carrier head 200 of the present embodiment can be used either with an ECMPR process or with a CMP process. In use, vacuum to hold the wafer on the carrier is kept on throughout the process. As previously mentioned above in the background section, however, in the prior art CMP systems, during the CMP process vacuum is turned off and the wafer is kept on the carrier head by a retaining ring.

Figure 4A:
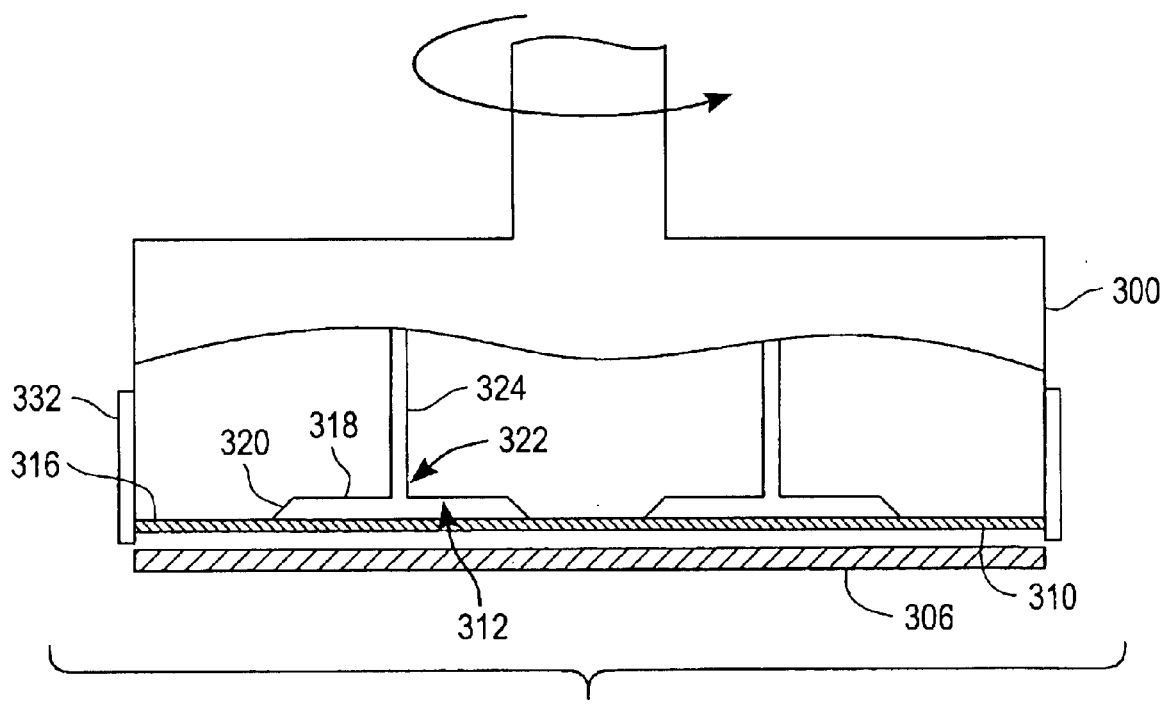
FIGS. 4A–4C illustrates a third embodiment of a carrier head according to the present invention.
Figure 4B:
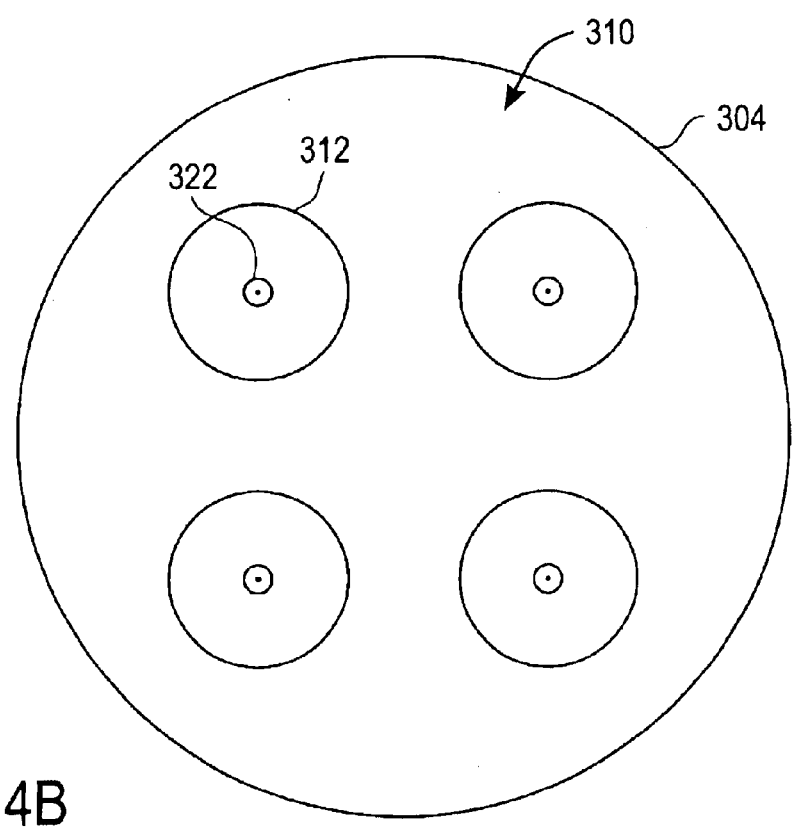

In another embodiment, as shown in FIG. 4A, the carrier head 300 comprises a carrier body 302 and a carrier base 304 where the wafer 306 is held. The carrier head 300 of the present embodiment can be used in an ECMPR system. The carrier head 300 is rotated or moved through the shaft 308. The carrier base 304 comprises a raised surface area 310 and a number of recessed or cavity surface areas 312. As shown in FIG. 4B in plan view, the raised surface area 310 is a circular area in the preferred embodiment, corresponding to the shape of the wafer 306. A flexible membrane 314 preferably made of Viton, preferably 0.2–0.6 millimeter thick, sealably encloses raised surface area and hence the cavities 312 along the circumference of the raised surface area 310. The flexible membrane 314 is circular in shape and attached to the circumference of the raised surface area 310 at an edge region 316 of the membrane 314 preferably using glue and fasteners as in the previously described embodiment.

Each of the cavity surface areas 312 has a predetermined cup shape, such as circular, having a bottom and inclined side walls 318, 320. The height of the walls is preferably in the range of 2 to 6 millimeters. Alternatively, the cavity surface areas 312 may have a concave shape having curved side walls and bottom wall. The bottom walls 318 may have vacuum ports 322 connected to a vacuum source (not shown) through vacuum lines 324.

Figure 4C:
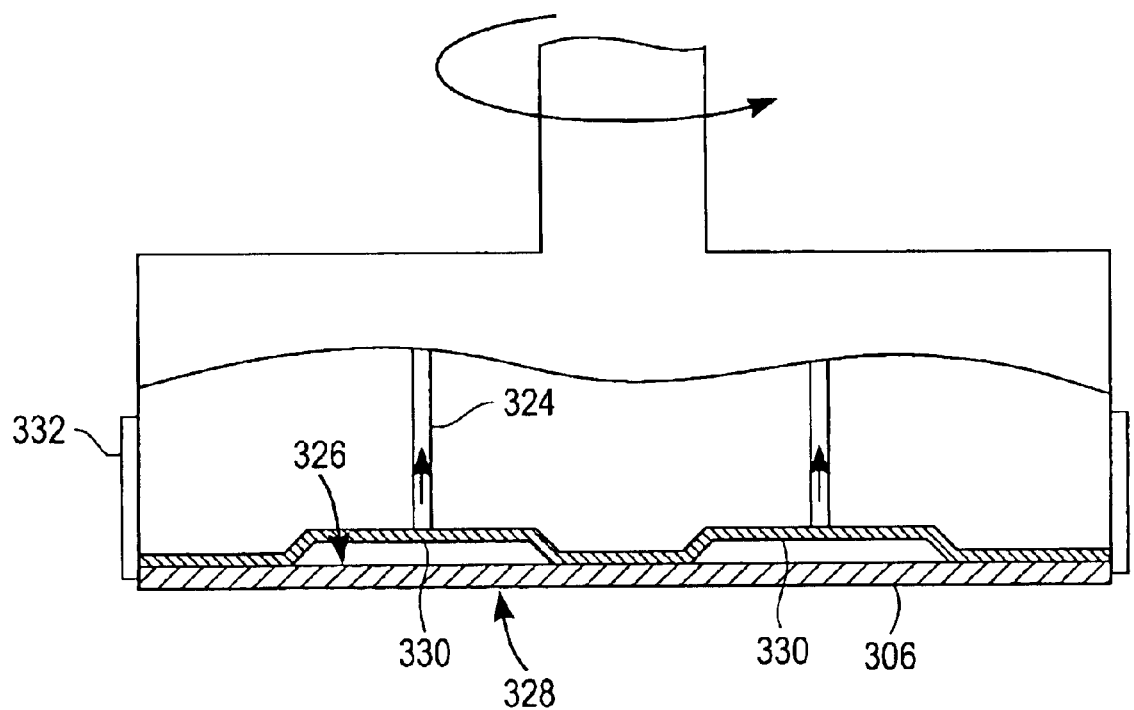
Figure 2B:
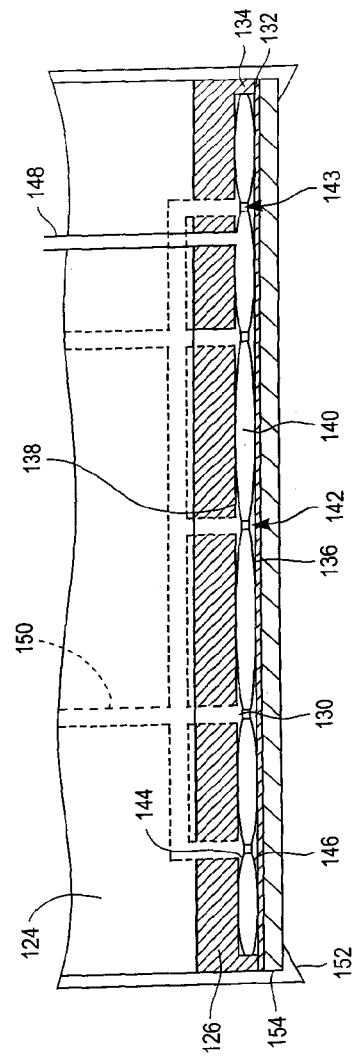

As shown in FIG. 4C, in operation, backside 326 of the wafer 306 is placed on the flexible membrane 314 and a vacuum, preferably in the range of 15-25 inches of Hg is applied to hold the wafer 306 on the carrier 300. It is understood that in this embodiment front surface 328 of the wafer 306 is fully exposed. The cavities 312 are then evacuated as the vacuum suction is applied. As the vacuum suction is applied to the cavities 312, portions 330 of the membrane 314 covering the cavities 312 collapse into the cavities. This in turn, generates a plurality of low pressure spaces on the back surface of the wafer. Such low pressure spaces provide adequate suction power to retain the wafer 306 to the carrier 300 during the ECMPR such as ECMD or ECME processes. In this embodiment, a retaining ring 332 may be placed around the carrier 300 to prevent the lateral displacement of the wafer 306. However, the carrier 300 can be used without having the retaining ring 332.

It should be understood, of course, that the foregoing relates to preferred embodiments of the invention and that modifications may be made without departing from the spirit and scope of the invention.

What is claimed is:

1. A method of holding a wafer during processing comprising the steps of:

providing a carrier head that includes an inner flexible membrane and an outer gasket member along a base of the carrier head;

aligning the wafer with the carrier head;

applying a vacuum between the outer gasket member and the inner flexible member, thereby causing the wafer to attach to the carrier head; and processing the wafer, wherein the presence of the inner flexible membrane provides compliant wafer support.

2. The method according to claim 1 wherein at least a portion of the step of inflating occurs prior to the step of applying.

3. The method according to claim 1 wherein the step of processing performs one of chemical mechanical polishing and electrochemical mechanical processing.

4. A substrate carrier head for holding a wafer during processing that is capable of receiving a vacuum and holds a wafer from a backside of the substrate during processing of the substrate, the substrate carrier head comprising:

a base;

a flexible membrane disposed over the base to which physical contact with a substantial backside portion of the wafer is made;

a gasket member disposed at an outer perimeter of the base around the flexible membrane; and at least one vacuum inlet disposed between the flexible membrane and the gasket member, the vacuum inlet connectable to the vacuum to allow the backside of the substrate to be held on the flexible membrane and the gasket member, with vacuum pressure therebetween.

5. The substrate carrier according to claim 4 wherein the flexible membrane is inflatable, and further comprising at least one fluid inlet attached to the inflatable flexible membrane through which a fluid can pass to inflate the inflatable flexible membrane.

6. The substrate carrier according to claim 5 wherein the gasket member is an o-ring.

7. The substrate carrier according to claim 4 wherein processing of the substrate comprises one of chemical mechanical polishing and electrochemical mechanical processing.

8. The method according to claim 1, further comprising inflating the inner flexible membrane.

* * * * *

UNITED STATES PATENT AND TRADEMARK OFFICE
CERTIFICATE OF CORRECTION

PATENT NO. : 6,716,084 B2
DATED : April 6, 2004
INVENTOR(S) : Basol et al.

It is certified that error appears in the above-identified patent and that said Letters Patent is hereby corrected as shown below:

<u>Drawings,</u>
Delete Sheet 3 of 6 consisting of Fig. 2B and replace with the new attached Fig. 2B.

Fig. 2B, arrowed reference numeral 102 should be removed
reference numeral 106 should be removed
reference numeral 130 should be applied to the cavity
reference numeral 132 should be applied to the membrane
reference numeral 136 should be removed from the inflatable pockets and applied to the backing member
reference numeral 142 should be applied to the connection regions
reference numeral 140 should be applied to the inflatable pockets
reference numeral 143 should be applied to the holes at the connection regions
reference numeral146 should be applied to the lower layer of the backing member Signed and Sealed this Twenty-sixth Day of October, 2004

JON W. DUDAS
*Director of the United States Patent and Trademark Office*